United States Patent
Itatani et al.

(10) Patent No.: US 7,524,766 B2
(45) Date of Patent: Apr. 28, 2009

(54) METHOD FOR MANUFACTURING SEMICONDUCTOR DEVICE AND SUBSTRATE PROCESSING APPARATUS

(75) Inventors: Hideharu Itatani, Tokyo (JP); Sadayoshi Horii, Tokyo (JP); Masayuki Asai, Tokyo (JP); Atsushi Sano, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 198 days.

(21) Appl. No.: 10/521,248

(22) PCT Filed: Jul. 15, 2003

(86) PCT No.: PCT/JP03/08964

§ 371 (c)(1),
(2), (4) Date: Apr. 11, 2005

(87) PCT Pub. No.: WO2004/008513

PCT Pub. Date: Jan. 22, 2004

(65) Prior Publication Data

US 2005/0250341 A1 Nov. 10, 2005

(30) Foreign Application Priority Data

Jul. 15, 2002 (JP) ............................... 2002-205627

(51) Int. Cl.
*H01L 21/302* (2006.01)
*H01L 21/461* (2006.01)

(52) U.S. Cl. ...................... 438/685; 438/681; 427/97.6; 427/96.8; 257/E21.295; 257/E21.584

(58) Field of Classification Search ................. 438/685, 438/686, 681; 257/E21.295, E21.584, E21.478; 427/97.6, 96.8
See application file for complete search history.

(56) References Cited

U.S. PATENT DOCUMENTS 5,306,666 A 4/1994 Izumi (Continued)

FOREIGN PATENT DOCUMENTS

EP 1 130 628 A1 9/2001

(Continued)

*Primary Examiner*—Caridad M Everhart
(74) *Attorney, Agent, or Firm*—Oliff & Berridge, PLC

(57) ABSTRACT

To obtain a conductive metal film having superior step coverage, adhesiveness, and high productivity. A conductive metal film or metal oxidized film suitable as a capacitor electrode is formed on a substrate by performing an excited-gas supplying step after a source gas supplying step. In the source gas supplying step, gas obtained by vaporizing an organic source is supplied to the substrate, and the gas thus supplied is allowed to be adsorbed on the substrate. In the excited-gas supplying step, oxygen or nitrogen containing gas excited by plasma is supplied to the substrate to decompose the source adsorbed on the substrate, thus forming a film. An initial film-forming stop is a step of forming the film by repeating the source gas supplying step and the excited-gas supplying step once or multiple times. A desired thickness can be obtained by one step of the initial film-forming step. However, thereafter, in addition to the initial film-forming step, the film-forming step may be two steps by performing the main film-forming step of simultaneously supplying the gas obtained by vaporizing the organic source and oxygen containing gas or nitrogen containing gas not excited by plasma by using a thermal CVD method.

3 Claims, 6 Drawing Sheets

U.S. PATENT DOCUMENTS

| | | | |
|---|---|---|---|
| 5,789,321 A | 8/1998 | Ohshita | |
| 6,143,659 A | 11/2000 | Leem | |
| 6,500,350 B1 * | 12/2002 | Hunt et al. | 216/16 |
| 6,617,248 B1 * | 9/2003 | Yang | 438/686 |
| 2001/0024387 A1 * | 9/2001 | Raaijmakers et al. | 365/200 |
| 2001/0054769 A1 | 12/2001 | Ivo et al. | |
| 2002/0028578 A1 * | 3/2002 | Lu et al. | 438/683 |
| 2002/0197856 A1 * | 12/2002 | Matsuse et al. | 438/652 |
| 2004/0018304 A1 * | 1/2004 | Chung et al. | 427/250 |

FOREIGN PATENT DOCUMENTS

| | | |
|---|---|---|
| JP | A 01-204434 | 8/1989 |
| JP | A 04-198484 | 7/1992 |
| JP | A 04-361531 | 12/1992 |
| JP | A 09-260373 | 10/1997 |
| JP | A 2000-144421 | 5/2000 |

* cited by examiner

# METHOD FOR MANUFACTURING SEMICONDUCTOR DEVICE AND SUBSTRATE PROCESSING APPARATUS

TECHNICAL FIELD

The present invention relates to a method of manufacturing a semiconductor device and a substrate processing apparatus for forming a conductive metal film on a substrate.

BACKGROUND ART

In order to obtain a storage charge capacity for a DRAM capacitor associated with its microminiaturization, increase in a dielectric constant of a capacitor insulating film and metallization of a lower or upper electrode have been actively studied. Candidates of materials therefor may include $Ta_2O_5$, BST ($(Ba, Sr)TiO_3$), and PZT ($(Pb, Zr)TiO_3$), which have high dielectric constants, as a capacitor insulating film, and precious metal such as Ru, Pt and/or Ir, which are resistant to oxidizing and exhibit conductivity even when oxidized, or the oxide thereof as an electrode. In order to obtain a high storage charge capacity, a cylinder type capacitor electrode having high aspect ratio is currently a main stream. Therefore, all of the films containing TiN and/or TaN, which are barrier metal films, are required to be excellent in step coverage. As a method for forming a film, trend is toward thermal CVD excellent in step coverage from conventional sputtering. In the thermal CVD, reaction of an organic metal liquid source and oxygen-containing gas or nitrogen-containing gas is used.

Generally, when a conductive metal film is formed by thermal CVD by using gas obtained by vaporizing an organic source for further improving step coverage, a manufacturing process needs to be conducted at lower temperature. However, by lowering temperature, a large amount of carbon and/or oxygen in the organic source remains as impurities in the metal film, which deteriorates the electric characteristic. Furthermore, due to heat treatment (annealing) in a later process to be performed for crystallization, for example, gas disorption of the impurities may occur, which may cause film-peeling. Furthermore, as for several organic sources such as an Ru source, there is a report that incubation time is increased, thereby posing a problem that productivity is inferior. Furthermore, manufacture of a conductive metal film having a good characteristic by using an existing substrate processing apparatus is not easy.

In order to overcome the problems of the above-described conventional technologies, an object of the present invention is to provide a method of manufacturing a semiconductor apparatus having a good characteristic and high productivity and a substrate processing apparatus capable of forming a conductive metal film having good characteristics by easy manufacture.

DISCLOSURE OF THE INVENTION

In order to solve the aforementioned problems, the present invention takes several aspects as follows a first aspect of the present invention provides a manufacturing method of a semiconductor device, comprising:

In a first aspect, a manufacturing method of a semiconductor device comprises the steps of:

supplying gas obtained by vaporizing an organic source to a substrate; and thereafter supplying gas excited by plasma for forming a conductive metal film.

Here, the conductive metal film also includes a conductive metal oxide film. A conductive metal film can be formed by supplying the gas obtained by vaporizing the organic source to a substrate and then supplying gas excited by plasma to react with the gas obtained by vaporizing the organic source. In the metal film, elements in an organic source captured as impurities into the film can be reduced by an action of plasma-excited-gas and the electric characteristic does not deteriorate even when the process temperature is reduced. Thus, improvement for film quality after the film formation is not required. Furthermore, film peeling due to impurities may not occur easily even when annealed after the film formation. Furthermore, since a film is formed by supplying source gas and then supplying plasma-excited-gas to cause a complete surface reaction, no incubation time occurs. Thus, good productivity can be achieved. Furthermore, a metal film having good step coverage can be formed. Therefore, a conductive metal film having good characteristics and high productivity can be formed.

In a second aspect, the method of manufacturing the semiconductor device according to the first aspect of the invention is provided, wherein the source gas supplying step and the excited gas supplying step are repeated multiple times.

Since the source gas step and the excited-gas supplying step are repeated multiple times, a film thickness can be controlled and a metal film having a predetermined thickness can be formed easily. Since impurities in a film can be removed every time plasma-excited-gas is supplied, improvement for film quality after the film formation is not required, thus allowing the processing to be easy. Furthermore, since a conductive metal film is formed by repeating the supply of source gas and the supply of plasma-excited-gas from the beginning to the end a uniform conductive metal film from which impurities are effectively and uniformly removed over the entire film can be formed.

In a third aspect, the method of manufacturing the semiconductor device according to the second aspect of the invention in provided, wherein the total film thickness of the conductive metal film is 20 to 50 nm. If the film is formed having the film thickness of 20 to 50 nm, the conductive metal film is suitable for an electrode. When the film thickness is smaller than 20 nm, function of the electrode is deteriorated or sufficient strength can not be kept, and this is not preferable. Furthermore, when the film thickness is larger than 50 nm, microminiatuarization is inhibited, and this is not preferable.

In a forth aspect, the method of manufacturing the semiconductor device according to the first aspect of the invention is provided, wherein an annealing process is performed without a film quality improving process for removing impurities in the film after film formation. Since impurities in a film can be removed by the excited-gas supplying step, annealing can be performed without improving the film quality, thereby further improving productivity.

In a fifth aspect, the method of manufacturing the semiconductor device according to the first aspect of the present invention is provided, wherein oxygen containing gas or nitrogen containing gas is excited by plasma and the gas thus excited by plasma is supplied in the excited-gas supplying step.

When the oxygen containing gas or the nitrogen containing gas is excited by plasma and supplied in the excited-gas supplying step, a conductive metal-oxide film or metal-nitride film having a lower amount of impurities in the film can be formed.

In a sixth aspect, the method of manufacturing the semiconductor device according to the first aspect of the present invention is provided, wherein at least one kind of gas selected from a group of $O_2$, $N_2O$, Ar, $H_2$, $N_2$ and $NH_3$ is excited by plasma and supplied in the excited-gas supplying step. While oxygen $O_2$ is generally supplied as an oxidizing agent, the above-described oxygen-containing gas $N_2O$, inert gas Ar, hydrogen $H_2$, nitrogen $N_2$ or nitrogen-containing gas $NH_2$ may also be excited and supplied to an organic source supplied to the substrate instead of oxygen $O_2$, thus facilitating decomposition of the source and proceeding film-forming reaction.

In a seventh aspect, the method of manufacturing the semiconductor device according to the first aspect of the invention is provided, wherein the gas obtained by vaporizing the organic source is supplied to the substrate and adsorbed on the substrate in the source gas supplying step, and the gas excited by plasma is supplied to the substrate and the gas is caused to react with the organic source adsorbed on the substrate, thereby forming the film in the excited-gas supplying step.

In the source gas supplying step, only the gas obtained by vaporizing the organic source is supplied to the substrate, thereby allowing the source to be adsorbed on the substrate with the reaction suppressed. Here, when plasma-excited-gas is supplied in the excited-gas supplying step, the source adsorbed on the substrate is decomposed. Then, the decomposed source reacts with plasma-excited-gas to form a film. In this film-forming stage, a surface reaction is caused in such a way that the plasma excited-gas reaction with the source which is adsorbed on the substrate surface, generating no incubation time, and therefore such a manufacturing method is superior in productivity. In addition, gas species exited by plasma has high reactivity. Thus, by combining with elements such as carbon, oxygen and nitrogen contained in the organic source as impurities, the impurities in the film are formed into gas, thereby reducing an amount of the impurities in the film. Therefore, improving the film quality is not required for the film formed in the excited-gas supplying step, and the film obtained after film formation is not peeled by annealing.

In an eighth aspect, the method of manufacturing the semiconductor device according to the first aspect of the invention is provided, further comprising a step of replacing gas between the source gas supplying step and the excited-gas supplying step.

Here, the gas used for gas replacement is preferably non-reactive gas, which does not react with vaporized gas. The gas replacement also includes evacuation. When the step of gas replacement is provided between the source gas supplying step and the excited-gas supplying step, the simultaneous existence of the gas obtained by vaporizing the organic source and the plasma-excited-gas can be prevented in an atmosphere. Thus, the generation of particles can be prevented. Furthermore, when inert gas such as $N_2$ is used as non-reactive gas for the gas replacement, an amount of adsorption of the gas obtained by vaporizing the organic source on the substrate can be made uniform.

In a, ninth aspect, the method of manufacturing the semiconductor device according to the second aspect of the invention is provided, further comprising the step of:

Performing gas replacement between the source gas supplying step and the excited-gas supplying step or between the excited-gas supplying step and the source gas supplying step. Here, the gas used for the gas replacement is preferably non-reactive gas, which neither reacts with vaporized gas nor reacts with excited-gas. The gas replacement also includes evacuation. When the step of performing gas replacement is provided between the source gas supplying step and the excited-gas supplying step or after the source gas supplying step and after the excited-gas supplying step, the simultaneous existence of the gas obtained by vaporizing the organic source and plasma-excited-gas can be prevented in an atmosphere. Thus, the generation of particles can be prevented. Furthermore, when inert gas such as $N_2$ is used as non-reactive gas for the gas replacement, the amount of adsorption of the gas obtained by vaporizing the organic source into the substrate is made uniform.

In a tenth aspect, the method of manufacturing the semiconductor device according to the first aspect of the invention is provided, wherein the conductive metal film is a capacitor electrode or a barrier metal film. When a conductive metal film is applied to the capacitor electrode or the barrier metal film for prevention of diffusion, a cylindrical electrode having superior step coverage and high aspect ratio can be realized.

In an eleventh aspect, the method of manufacturing the semiconductor device according to the first aspect of the invention is provided wherein the conductive metal film is any one of the films selected from the group of an Ru film, an $RuO_2$ film, a Pt film, an Ir film, an $IrO_2$ film, a TiN film and a TaN film. When the conductive metal film is formed by precious metal or the oxide or a Ti or Ta nitride as described above, a capacitor having MIM (Metal Insulator Metal) structure of the next generation can be formed. Thus, a storage charge capacity of a DRAM can be ensured. Especially, when the conductive metal film is a capacitor electrode, the capacitor electrode with low resistance is obtained, and the storage charge capacity associated with microminiaturization of the DRAM can be ensured.

In a twelfth aspect, the method of manufacturing the semiconductor device according to the first aspect of the invention is provided, wherein the organic source supplied in the source gas supplying step is any one of the elements selected from the group of $Ru(C_2H_5C_5H_4)_2$, (bisethylcyclopentadienylrutheniu) ($Ru(EtCp)_2$ for short), $Ru(C_5H_5)(C_4H_9C_5H_4)$, (butyl-ruthenocene), $Ru[CH_3COCHCO(CH_2)_3CH_3]_3$, (tris 2,4 octanedionatoruthenium), $Ru(C_2H_5C_5H_4)((CH_3)C_5H_5)$, (2,4 dimethylpentadienylethylcyclopentadienylrutherium), ($Ru(OD)_3$ for short), and $Ru(C_7H_8)(C_7H_{11}O_2)$, and the conductive metal film is an Ru film or an $RuO_2$ film. When the source gas adsorbed on the substrate can be decomposed by plasma-excited-gas, the above-described oxygen $O_2$, oxygen-containing gas $N_2O$, nitrogen $N_2$, hydrogen $H_2$ or inert gas Ar can be used in the excited-gas supplying step.

In a thirteenth aspect, the method of manufacturing the semiconductor device according to the first aspect of the invention is provided, wherein the organic source supplied in the source gas supplying step is any one of the elements selected form the group of $Ti[OCH(CH_3)_2]_4$, $Ti(OCH_2CH_3)_4$, $Ti[N(CH_3)_2]_4$, and $Ti[N(CH_3CH_2)_2]_4$, and the conductive metal film is a TiN film. When the source gas adsorbed on the substrate can be decomposed by plasma-excited-gas, $NH_3$, Ar, $H_2$ or $N_2$ gas can be used in the excited-gas supplying step.

In a fourteenth aspect, the method of manufacturing the semiconductor device according to the first aspect of the invention is provided, wherein the organic source to be supplied in the source gas supplying step is $Ta(C_2H_5O)_5$, and the conductive metal film is a TaN film. When the source gas adsorbed on a substrate can be decomposed by plasma-excited-gas, $NH_3$, Ar, $H_2$ or $N_2$ gas can be used in the excited-gas supplying step.

In a fifteenth aspect, the method of manufacturing the semiconductor device according to the first aspect of the invention is provided, wherein the source gas supplying step and the excited-gas supplying step are performed at the temperature of 250 to 350° C. and with the pressure of 0.1 to several Torr. Since the film is formed at the low temperature of 250 to 350° C. and with the low pressure of 0.1 to several Torr, the metal film excellent in step coverage and having desired film quality characteristics can be obtained.

In a sixteenth aspect, a method of manufacturing a semiconductor device is provided, comprising:

an initial film-forming step of forming a conductive metal film on a substrate; and a main film-forming step of forming a conductive metal film on the film formed in the initial film-forming step, the initial film-forming step comprising:

a source gas supplying step of supplying gas obtained by vaporizing the organic source to the substrate; and therafter an excited-gas supplying step of supplying gas excited by plasma, and the main film-forming step, comprising:

a step of simultaneously supplying gas obtained by vaporizing the organic source and oxygen-containing gas or nitrogen-containing gas not excited by plasma.

Here, the oxygen-containing gas also includes oxygen gas. The nitrogen-containing gas also includes nitrogen gas. By performing the initial film-forming step by using the first or second aspect of the present invention, no incubation time occurs in the initial film-forming step. Furthermore, since the main film-forming step is performed for forming the same film as the film formed in the initial film-forming stop as a base, no incubation time occurs also in the main film-forming step. Furthermore, since the main film-forming step is performed by using thermal CVD, the film-forming speed can be improved and the productivity can be further improved by repeating the supply of source gas and the supply of plasma-excited-gas from the beginning to the end in comparison with a case that a conductive metal film is formed.

Also in the sixteenth aspect of the present invention including the initial film-forming step and the main film-forming step, improvement of the film quality is not required for the film formed in the initial film-forming step, in the same way as the film of the fourth aspect of the present invention. Thus, even when the improvement of the film quality is required for the film formed by thermal CVD in the main film-forming step, the productivity can be improved. When the improvement of the film quality is not required for the film formed by thermal CVD in the main film-forming step, the productivity can be further improved compared with a case that the film is formed by only the same method as that of the initial film-forming step.

In a seventeenth aspect, the method of manufacturing the semiconductor device according to the sixteenth aspect of the invention is provided, wherein film thickness of the film in the initial film-forming step is 5 to 15 nm, and the film thickness of the film formed in the main film-forming step is 20 to 40 nm.

When the film having the film thickness of 5 to 15 nm is formed in the initial film-forming step, preferably a stable interface film can be formed with good productivity. When the film thickness is smaller than 5 nm, a stable interface film cannot be formed. Meanwhile, when the film thickness is larger than 15 nm, the productivity is deteriorated. When the film having the film thickness of 20 to 40 nm is formed in the main film-forming step, preferably a desired thickness having mechanical strength in total can be formed with good productivity. When the film thickness is smaller than 20 nm, the strength cannot be maintained. Meanwhile, when the film thickness is larger than 40 nm, the productivity is deteriorated.

In an eighteenth aspect, the method of manufacturing the semiconductor device according to the sixteenth aspect of the invention is provided, wherein the main film-forming step is a step of forming the film by thermal CVD, and the initial film-forming step and the main film-forming stop are performed at the same temperature. Here, in order to perform the initial film-forming step and the main film-forming step by thermal CVD at the same temperature, the initial film-formation may be performed at the temperature at which the film can be formed by thermal CVD. When the initial film-forming step and the main film-forming step are performed at the same temperature, temperature reducing and rising operation for the substrate that requires time can be eliminated when the processing is advanced from the initial film-forming step to the main film-forming step, thereby significantly improving the productivity. Particularly, when the initial film-forming step and the main film-forming step are performed in the same processing chamber, the initial film-formation, and the main film-formation can be performed continuously. Thus, the productivity can be further improved, and the manufacturing cost can be reduced.

In a nineteenth aspect, the method of manufacturing the semiconductor device according to the sixteenth aspect of the invention is provided, wherein the initial film-forming step and the main film-forming step are performed at the temperature of 250° C. to 350° C. The temperature of 250° C. to 350° C. is the temperature at which the film can be formed by thermal CVD, and, when the initial film-forming step is performed at the same temperature as the aforementioned temperature, the initial film-formation and the main film-formation can be performed easily at the same temperature. Thus, the electric characteristic and productivity of the film can be significantly improved.

In a twentieth aspect a substrate processing apparatus is provided, comprising:

a processing chamber for processing a substrate;

a heater for heating the substrate in the processing chamber;

a source gas supply port for supplying an organic source gas for forming a conductive metal film in the processing chamber;

an exciting unit for exciting gas by plasma;

an excited-gas supplying port for supplying the gas excited by plasma into the processing chamber;

an exhaust port for exhausting interior of the processing chamber; and a control unit for controlling the gas excited by plasma so as to be supplied to the substrate after organic source gas is supplied to the substrate.

When the conductive metal film is formed by using the substrate processing apparatus having the control unit for controlling so that the gas excited by plasma is supplied to the substrate after the gas obtained by vaporizing the organic source is supplied to the substrate, the method of manufacturing the semiconductor apparatus of the first aspect of the present invention can be automated, thereby further facilitating the operation. When providing a control unit for controlling so that the supply of the gas obtained by vaporizing the organic source and the supply of plasma-excited-gas are repeated multiple times, the method of manufacturing the semiconductor device of the second aspect of the present invention can be performed easily. Furthermore, after film-formation, when providing a control unit for controlling so that the annealing process is performed without performing the film quality improving process, the method of manufacturing the semiconductor device of the fourth aspect of the present invention can be performed easily. Furthermore, when providing a control unit for controlling so that the main film-formation is performed by thermal CVD after the initial film-formation in which the supply of source gas and the supply of excited-gas are repeated once or multiple times the method of manufacturing the semiconductor device of the sixteenth aspect of the present invention can be performed easily.

Next, the aforementioned method of manufacturing the semiconductor device of the present invention will be more specifically by dividing the methods into two methods of a first method for repeating the supply of source gas and the supply of plasma-excited gas and a second method for performing the main film-forming process by thermal CVD after the initial film-forming process for repeating the supply of source gas and the supply of plasma-excited-gas once or multiple times.

In the first method, the metal film is formed by repeating the supply of source gas and the supply of excited-gas from the beginning to the end as follows:

(1) First of all, the organic source such as $Ru(C_2H_5C_5H_4)_2$ (bisethylcyclopentadlenylruthenium: $(Ru(EtCp)_2$, for short) is vaporized by a vaporizer and is supplied onto the substrate in a processing chamber along with carrier gas. Here, the source gas is adsorbed on the substrate surface with good step coverage.

(2) Next, the gas is replaced by purging the residual gas obtained by vaporizing the organic source in the processing chamber by inert gas such as $N_2$ gas or exhausting the interior of the processing chamber by evacuation through an exhaust pipe. Thus, vapor-phase source gas is exhausted, and the reaction on the substrate surface is mainly progressed.

(3) Thereafter, plasma-excited-gas such as oxygen excited by plasma is supplied. Here, the source adsorbed on the substrate surface reacts with the gas such as excited oxygen, and the film is formed on the surface of the substrate.

(4) Furthermore, the residual gas such as oxygen in the processing chamber is purged by the inert gas such as $N_2$ gas or replaced by evacuation.

The film is formed in a stepwise manner by repeating the steps (1) to (4) from the beginning to the end. In this case, the film is formed generally at the substrate temperature of 250° C. to 350° C., with the pressure of 0.1 to several tens Torr, and within several minutes of gas supply time.

Next, in the second method, the initial film-forming step is performed by the above-described first method. Then, in the main film-forming step to be performed thereafter, gas such as oxygen-containing gas or nitrogen-containing gas not excited by plasma and the gas obtained by vaporizing the organic source such as $Ru(EtCp)_2$ are supplied simultaneously so that the film can be formed by the well-known thermal CVD. In this case, the film is formed generally at the substrate temperature of 250° C. to 350° C., with pressure of 0.1 to several tens Torr, and within 1 to 5 minutes of gas supply time. In the second method, the fist method is applied only to the initial film-formation, that is, to the formation of an interface layer only on the substrate.

1 Substrate
4 Heater Unit
4a Heater
5 Processing Chamber
9 Exhaust Pipe (Exhaust Port)
11 Plasma Generator (Exciting Unit)
40 Source Gas Pipe (Source Gas Supply Port)
50 Plasma Exciting Pipe (Excited-gas Supplying Port)
60 Control Apparatus

BEST FOR CARRYING OUT THE INVENTION

Embodiments of the invention will be described below.

Figure 5:
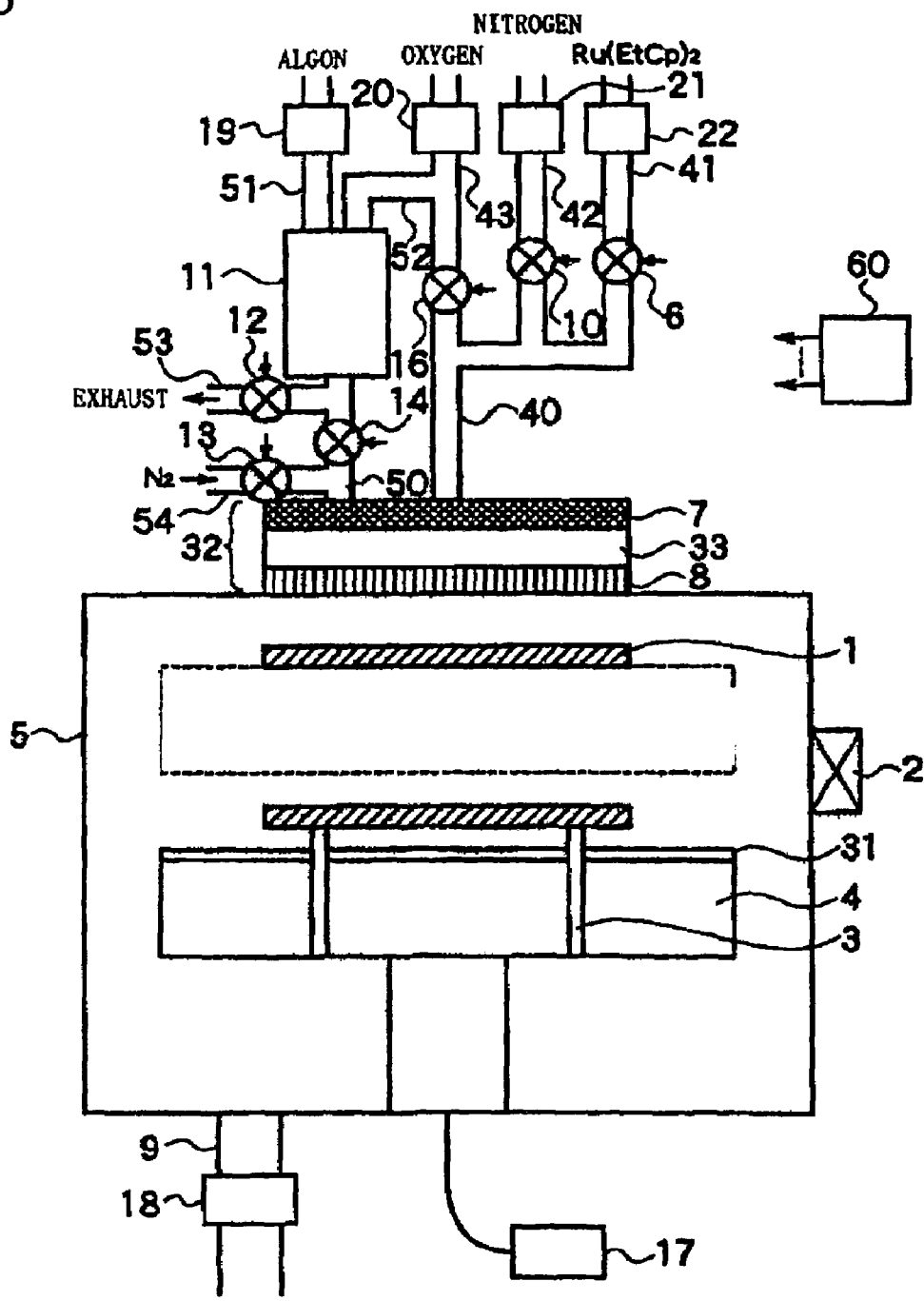
FIG. 5 is a schematic block diagram for describing an example of a single wafer thermal CVD apparatus according to an embodiment.

FIG. 5 is a schematic diagram showing a construction example of a single-wafer thermal CVD apparatus, which can be used as a substrate processing apparatus, for performing a method of the present invention. The single-wafer thermal CVD apparatus includes a processing chamber 5 for forming a conductive metal film on a substrate such as a silicon wafer. A gate valve 2 is provided at a side opening of the processing chamber 5, and a substrate 1 is conveyed from/to the processing chamber through the gate valve 2 by using a conveying robot (not shown). A susceptor 31 supporting the substrate 1 is provided in the processing chamber 5. The susceptor 31 is integrally provided on a heater unit 4 in which a heater 4a for heating the substrate 1 is equipped. The heater unit 4 is installed so as to go up and down by an elevator (not shown) and also in a rotatable manner as needed in the processing chamber. The heater unit 4 is lowered to the position indicated by the solid line in conveying the substrate. Thus, a thrust pin 3 projects from a surface of the susceptor 31 so as to support the substrate 1. The heater unit 4 goes up to the position indicated by the dashed line during film formation, and, the thrust pin 3 is sunk under the surface of the susceptor, so that the susceptor 31 supports the substrate 1. The heater unit 4 is controlled by a temperature control part 17 and heats the substrate 1 on the susceptor 31 to a predetermined temperature.

A showerhead 32 is provided at the upper part of the processing chamber. The showerhead 32 includes a diffusion plate 7, a buffer space 33, and a shower plate a. The diffusion plate 7 diffuses gas supplied to the showerhead 32. The buffer space 33 allows the diffused gas to be dispersed. The shower plate 8 has many holes to spray the gas into the processing chamber 5. An exhaust pipe 9 is connected to the lower part of the processing chamber 5. The exhaust pipe 9 functions as an exhaust port exhausting the interior of the processing chamber 5. Pressure in the processing chamber 5 is adjusted by controlling an exhaust pipe conductance controller 18 provided in the exhaust pipe 9 by the control apparatus 60.

Pipes of two systems for supplying the gas are connected to the showerhead 32. One of the pipes is a source gas pipe 40 for supplying source gas for a metal film. The other pipe is a plasma-excited-gas pipe 50 for supplying plasma-excited-gas, thereby facilitating the decomposition of a source. The source gas pipe 40 is a pipe unifying three pipes of a vaporized gas pipe 41, an inert gas pipe 42 and a source decomposed gas pipe 43. The vaporized gas pipe 41 supplies $(Ru(C_2H_5C_5H_4)_2$ $(Ru(EtCp)_2$ for short) gas, which is the gas obtained by vaporizing the organic liquid source. The inert gas pipe 42 supplies nitrogen gas. The source-decomposed gas pipe 43 supplies oxygen gas. Thus, gas flowing these pipes can be supplied to the showerhead 32. The three pipes 41 to 43 include opening and closing valves 6, 10 and 16, respectively. The Ru(EtCp)$_2$ gas is generated by vaporizing Ru(EtCp)$_2$, which is an organic liquid source, by a vaporizer, not shown. A source gas supply port is constituted of at least the source gas pipe 40 and the shower head 32. Moreover, an excited-gas supply port is constituted of the plasma-excited-gas pipe 50 and the showerhead 32.

The plasma-excited-gas pipe 50 is connected to the plasma generator 11 as a remote plasma exciting unit. The plasma excited-gas pipe 50 supplies plasma excited-gas generated by the plasma generator 11 to the showerhead 32. A carrier gas pipe 51 and a branch pipe 52 are connected to the plasma generator 11. The carrier gas pipe 51 supplies argon as carrier gas. The branch pipe 52 branches off from the source-decomposed gas pipe 43. Thus, the plasma generator 11 excites oxygen gas supplied from the branch pipe 52 by plasma and promotes the activation of plasma with argon supplied from the carrier gas pipe 51 to the plasma generator 11, A bypass pipe 53 and an inert gas pipe 54 are branched off from the plasma-excited-gas pipe 50. The bypass pipe 53 in provided in the upstream of the valve 14 of the plasma excited-gas pipe 50, while the inert gas pipe 54 is provided in the downstream. The bypass pipe 53 functions to let the plasma excited-gas out from the plasma generator 11, while the inert gas pipe 54 functions to prevent backflow of the source gas by supplying nitrogen N$_2$ gas. Opening and closing valves 14, 12 and 13 are provided for the excited-gas pipe 50, the bypass pipe 53 and the inert gas pipe 54, respectively. In the same way as the plasma excited-gas pipe 50 in which the bypass pipe 53 for letting the plasma excited-gas out is provided, the bypass pipe for letting Ru(EtCp)$_2$ gas out from the vaporizer not shown may be provided in the upstream of the valve 6 of the vaporized gas pipe 41.

The opening/closing of the opening and closing valves 6, 10 and 16 and 12 to 14 are controlled by the control unit 60. Flow controllers (MFC) 22, 21, 20 and 19 are provided for the four pipes 41 to 43 and 51 to control the flow of the gas flowing through the pipes 41 to 43 and 51. The control is performed by the control unit 60.

A method of manufacturing the semiconductor device including a step of forming a conductive metal film by using a single-wafer thermal CVD apparatus having the above-described structure will be described based on a case that an Ru film is formed on a substrate, for example. Here, two embodiments will be described with respect to a case that Ru(EtCp)$_2$ gas is used an the gas obtained by vaporizing the organic liquid source and oxygen to used as the gas excited by plasma and the gas not excited by plasma.

Embodiment 1

Figure 1:
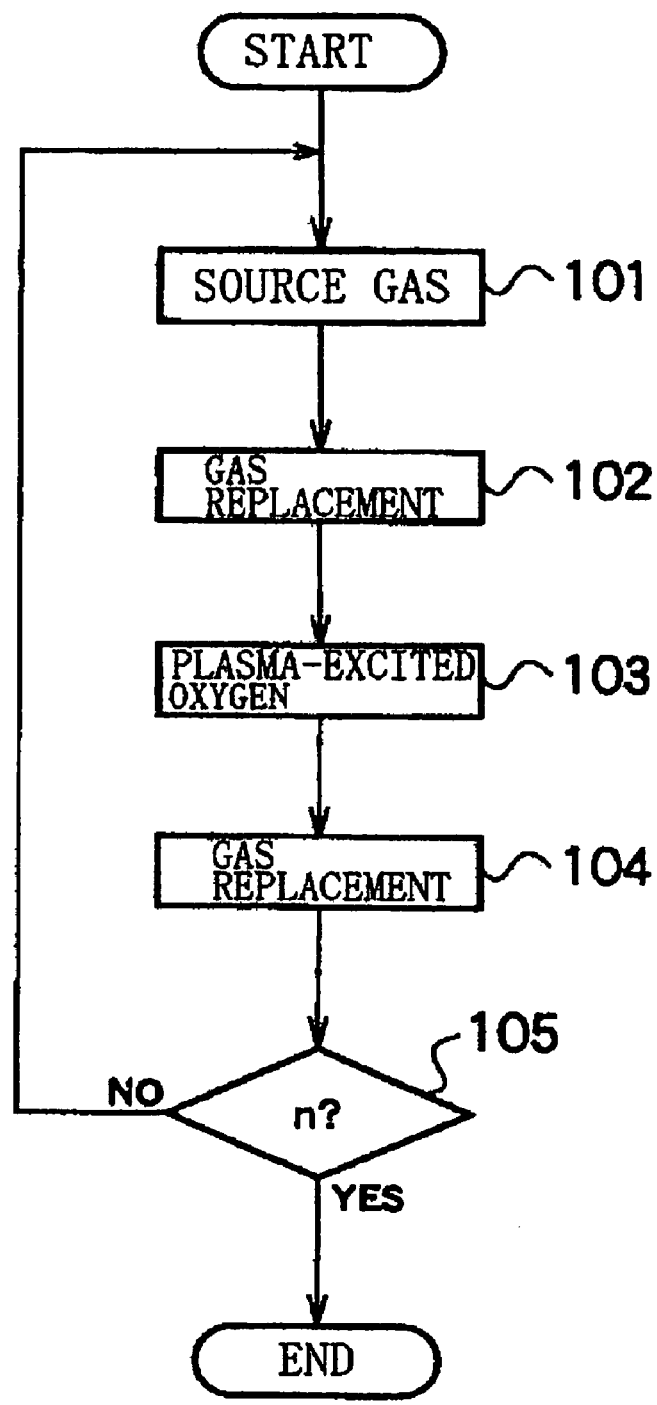
FIG. 1 is a flowchart for describing process steps according to a first embodiment.

FIG. 1 shows a flowchart according to Embodiment 1 for forming films by repeatedly supplying source gas and supplying plasma-excited oxygen once or multiple times.

In FIG. 5, the silicon substrate 1 is conveyed by a conveying robot (not shown) into the processing chamber 5 through the gate valve 2 and is placed on the thrust pins 3 projecting from the heater unit 4 when lowered. The substrate 1 is moved from the thrust pins 3 onto the susceptor 31 by raising the heater unit 4 to a predetermined film formation position (position indicated by the dashed line) by an elevator (not shown). The heater unit 4 is controlled by the temperature control unit 17, and the substrate 1 is heated through the susceptor 31 for a predetermined period of time. Here, the substrate temperature is maintained at 250° C. to 350° C. The exhaust pipe conductance controller 18 is controlled by the control unit 60, to exhaust the interior of the processing chamber 5 from the exhaust pipe 9. Thus, the pressure value in the processing chamber is stabilized at 0.1 to several tens of Torr (13.3 to several thousands of Pa). At this stage, the valves 6, 12, 14 and 16 are all closed under the control of the control unit 60. The valves 10 and 13 are opened to keep the exhausted condition, while supplying N$_2$ all the time into the processing chamber 5. After the pressure is stabilized, the valve 6 of the vaporized gas pipe 41 is opened to exhaust the interior of the processing chamber from the exhaust pipe 9, while supplying Ru(EtCp)$_2$ gas, which is a source gas, (also simply called Ru source gas or source gas, hereinafter) from the vaporized gas pipe 41 into the processing chamber 5 through the showerhead 32, and the source gas is thereby adsorbed on the substrate 1 (step 101). This step corresponds to a source gas supplying step.

Next, the valve 6 of the vaporized gas pipe 41 is closed so that the evacuation can be performed for a predetermined period of time. Alternatively, the valve 10 of the inert gas pipe 42 is closed so that the gas replacement in the processing chamber 5 can be performed by nitrogen N$_2$ purging for a predetermined period of time so as to remove Ru(EtCp)$_2$ gas therefrom (step 102). The step corresponds to a gas replacement step.

During the evacuation or gas replacement, argon and oxygen are supplied from the carrier gas pipe 51 and the branch pipe 52, respectively, to the plasma generator 11 so that oxygen can be excited by plasma. By opening the valve 12 of the bypass pipe 53, the excited oxygen is exhausted through the bypass pipe 53 so as to bypass the processing chamber 5. As described above, if the plasma excited oxygen is previously exhausted from the bypass pipe 53 during the gas replacement, the plasma-excited oxygen can be immediately supplied to the substrate by only switching the valves 12 and 14, at the time of supplying the plasma-excited-gas, thereby improving the throughput. Furthermore, by opening the valve 13 of the inert gas pipe 54 and supplying nitrogen N$_2$ gas to the showerhead 32 during the gas replacement, the backflow (or reverse diffusion) of Ru(EtCp)$_2$ gas to the plasma-excited-gas pipe 50 and adhesion of Ru(EtCp)$_2$ gas to the inside of the plasma-excited-gas pipe 50 can be prevented. Furthermore, the film-formation resulting from the reaction of the Ru(EtCp)$_2$ gas and residual oxygen in the plasma-excited-gas pipe 50 can be prevented. Note that even when a bypass pipe for letting Ru(EtCp)$_2$ gas out to the upstream of the valve 6 of the vaporized gas pipe 41 is provided, and if the gas is previously exhausted through the bypass pipe during gas replacement (step 104), as will be described later, the source gas can be immediately supplied only by switching the flow of the gas at the time; of supplying the source gas, thereby improving the throughput.

Next, the valve 12 of the bypass pipe 53 and the valve 13 of the inert gas pipe 54 are both closed, and the valve 14 of the plasma-excited-gas pipe 50 is opened. Then, plasma-excited oxygen excited by the plasma generator 11 is supplied to the substrate in the processing chamber 5 through the showerhead 32, and an Ru film is formed thereon (step 103) as a result. Specifically, by causing a reaction, of highly responsive plasma-excited oxygen and a source adsorbed on the substrate, the Ru film is formed. The step as described above corresponds to an excited-gas supplying step. In this condition, when the evacuation is performed by the gas replacement in the aforementioned step 102, the valve 10 of the inert gas pipe 42 is closed. When the gas replacement is performed by nitrogen N$_2$ purging, the valve 10 is kept open. Then, by supplying nitrogen gas from the inert gas pipe 42 to the showerhead 32, the film-formation resulting from the backflow (reverse-diffusion) of the plasma-excited oxygen to the source gas pipe 40 and the reaction of the plasma-excited oxygen and Ru(EtCp)$_2$ gas in the source gas pipe 40 can be prevented.

Next, the valve 10 of the inert gas pipe 42 and the valve 14 of the plasma-excited-gas pipe 50 are closed so that the evacuation of the processing chamber 5 can be performed for a predetermined period of time. Alternatively, the valve 10 of the inert gas pipe is opened so that the gas replacement in the processing chamber 5 can be performed by N$_2$ purging. Whereby the plasma-excited oxygen is let out (step 104). The step corresponds to a gas replacement step.

By repeating a cycle including the steps 101 to 104 including the source gas supplying step and the excited-gas supplying step (step 105), the Ru film having a desired thickness is formed. The number of cycles is once or plural times (n). The film thickness obtained by repeating the cycles is 20 to 50 nm.

Note that, while a single-wafer thermal CVD apparatus is in operation, preferably inert gas such as nitrogen gas is always supplied into the processing chamber 5. The inert gas is allowed to flow continuously not only when the substrate is carried in, the temperature of the substrate rises, and heat treatment is applied after the temperature is raised, but also when the gas obtained by vaporizing the organic source is supplied and the plasma excited oxygen is supplied. Therefore, preferably either valve 10 or valve 13 is opened before the substrate is carried in, and the inert gas is always supplied from either inert gas pipe 42 or 54 into the processing chamber 5. Thus, a purge condition is made in the processing chamber 5 all the time by the inert gas, thereby preventing particles and contaminants from adhering to the substrate, and the source gas thus adhered to the exhaust pipe 9 from reversely diffusing into the processing chamber, or oil from a vacuum pump not shown from reversely diffusing into the processing chamber.

Figure 2:
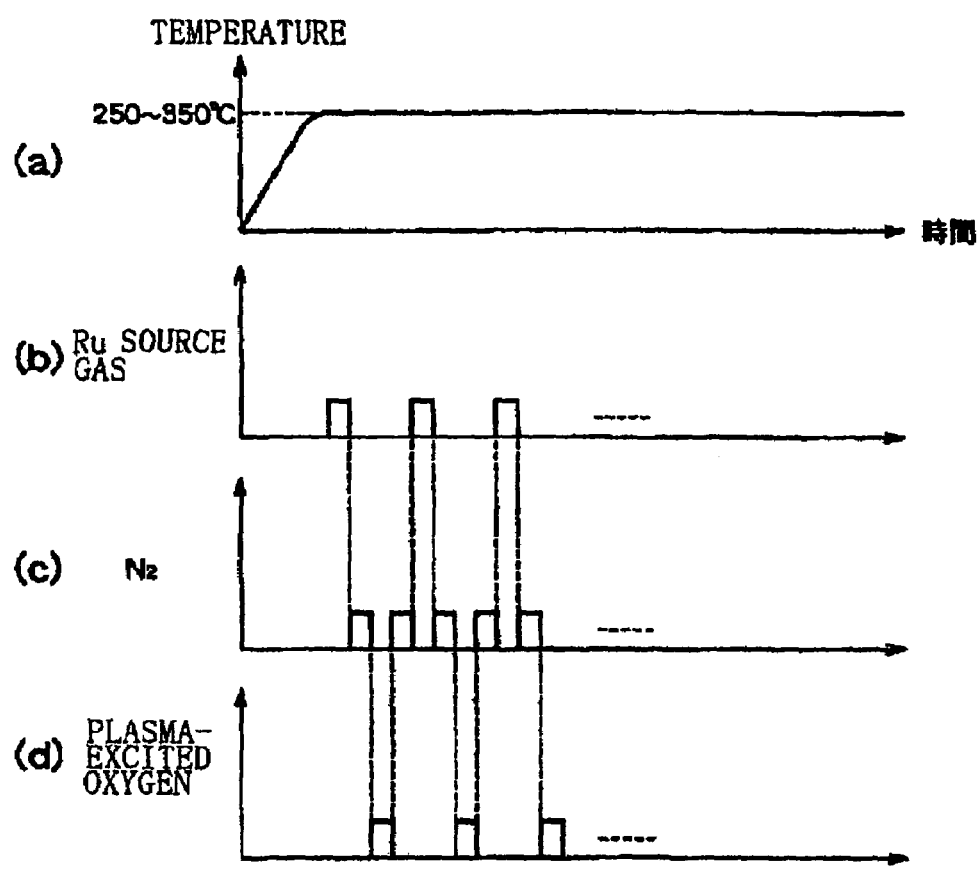
FIG. 2 is a timing chart for describing the process steps according to the first embodiment.

FIG. 2 shows a timing chart for repeating a cycle of [supply source gas→gas replacement→supply of plasma excited oxygen→gas replacement] according to the above-described Embodiment 1. (a) shows a substrate temperature rise characteristics with time at the abscissa, and temperature at ordinate. (b) shows timing for supplying Ru source gas, (c) shows timing for supplying N$_2$ gas and (d) shows timing for supplying plasma excited oxygen, with time at the abscissa, and supply amount (in arbitrary units) at the ordinate. According to Embodiment 1, the timing for supplying Ru source gas is after the substrate temperature rises to a film-forming temperature, 250 to 350° C. The cycle is repeated in such a manner that the Ru source gas is supplied at the above-described timing, thereafter the Ru source gas is purged from the processing chamber 5 by flowing the inert gas N$_2$, after purging the Ru source gas, the plasma excited oxygen is flown, and thereafter the inert gas N$_2$ is flown again, and the plasma excited oxygen is thereby purged. The processing time required per one cycle base is several seconds to several minutes. During temperature increase of the substrate for raising the substrate temperature to the film-forming temperature, the supply of the Ru source gas may be started, and the cycle processing may be started during the substrate temperature increase.

The substrate temperature, pressure in the processing chamber, argon flow amount, oxygen flow amount, nitrogen flow amount and Ru(EtCp)$_2$ flow amount in each step are adjusted to be desired film-forming conditions by controlling the heater unit 4, the exhaust pipe conductance controller 18, and the gas flow control apparatus 19 to 22 by the temperature control part 17 and the control unit 60. Upon completion of the film-forming step, the heater unit 4 is lowered to a transfer position (position indicated by the solid line) from the film-forming position (position indicated by the dashed line) by the elevator (not shown), and the substrate 1 is transferred on the trust pin 3 from the susceptor 31 during the fall of the substrate. The substrate 1 is carried out to the outside of the processing chamber 5 via the gate valve 2 by a robot for carrying (not shown).

As described above, according to Embodiment 1, after the gas Ru obtained by vaporizing the organic liquid source is supplied to a silicon substrate in the source gas supplying step (step 110), oxygen excited by plasma in the excited-gas supplying step (step 103) is supplied thereto. Thus, the oxygen is reacted with the gas obtained by vaporizing the organic liquid source adsorbed on the substrate surface, and the Ru film, which is a conductive metal film is thereby formed.

In the source gas supplying step, the gas obtained by vaporizing the Ru organic liquid is supplied to the substrate 1, and the source is thereby adsorbed on the substrate. In the excited-gas supplying step, when the plasma excited oxygen is supplied to the substrate, the source adsorbed on the substrate 1 is decomposed, the Ru source thus decomposed is reacted with the plasma excited oxygen, and the film is thereby formed. In the above-described film-forming state, the surface reaction is caused in such a way that the Ru source is reacted with the plasma-excited oxygen, with the source adsorbed on the substrate surface. Therefore, the film formation is progressed without generating incubation time. Accordingly, productivity of the semiconductor device having the metal film is improved with good step coverage also.

In order to improve the step coverage in forming the Ru film, the process temperature is reduced to 250° C. to 350° C. However, since the plasma-excited oxygen has still high reactivity even under the low temperature, the oxygen is combined to elements such as carbon C, oxygen O, and hydrogen H contained as impurities in the organic liquid source. Then, by forming the impurities thus combined into gas, the impurities in the film can be removed. In other words, the plasma-excited oxygen functions to facilitate the decomposition of the source adsorbed on the substrate and also functions to reduce the impurities (such as C, H and O) captured into the film. The Ru film having a good electric characteristic can be obtained since impurities in the film are reduced. Furthermore, because of the reduction of the impurities, the film formed by the excited-gas supplying step does not require film quality improvement. Furthermore, since annealing can be performed for crystallization without film quality improvement after film formation, the film quality improving process can be omitted, thus improving the productivity. In addition, film peeling due to the gas disorption of impurities is not caused easily even by the annealing after the film-formation, and the Ru film having good adhesiveness can be obtained.

Furthermore, since the source gas supplying step and the excited-gas supplying step are repeated multiple times for forming the film, the Ru film having a desired thickness (20 to 50 nm) can be formed with good controllability. Furthermore since the plasma-excited-gas having an impurity removing effect is supplied repeatedly in the film-forming cycle, the Ru film can be formed, from which the impurities are effectively and uniformly removed in the entire body of the metal film, compared with a case of forming the film having a prescribed thickness at one time, and thereafter improving the film quality.

Furthermore, since a conductive metal film is formed by using a single-wafer thermal CVD apparatus having a control apparatus 60 controlling to supply plasma-excited oxygen onto the silicon substrate after the Ru source gas is supplied to the substrate, the above-described manufacturing method of the semiconductor device can be automated, thereby further facilitating the work.

When the step of replacing gas by nitrogen (steps 102 and 104) is placed between the source gas supplying step (step 101) and the excited-gas supplying step (step 103), or after the source gas supplying step (step 101) and after the excited-gas supplying step (step 103), the Ru source gas and the plasma-excited oxygen do not remain in the processing chamber 5, thus equalizing the amount of the Ru source gas and the plasma-excited oxygen supplied to the substrate, by the control of the flow amount control apparatus 22 and 20. Furthermore, since the simultaneous existence of Ru source gas and plasma-excited oxygen in an atmosphere of the processing chamber 5 can be prevented, the generation of particles can be prevented. Furthermore, by replacing gas after the source gas supplying step, such an effect as equalizing absorption quantity of the source gas into the substrate is also obtained.

In addition, according to the embodiment 1, although the plasma-excited oxygen is used for decomposing the Ru organic liquid source, which is a metal film material, at a low temperature, the source decomposition can be facilitated and the film-forming reaction can be progressed even by using oxygen-containing gas $N_2O$, nitrogen $N_2$ or hydrogen $H_2$ or inert gas, and Ar gas, other than the plasma-excited oxygen $O_2$.

Furthermore, according to the embodiment 1, although improvement for film quality (impurity elimination processing) for removing impurities (such as C, H and O) in the film after film formation is not required the crystallization needs to be performed. For the crystallization, annealing is performed at the temperature of 400° C. to 800° C. in an $N_2$ or vacuum atmosphere. The annealing process is generally performed in a different processing chamber from the one for forming the film.

Embodiment 2

Figure 3:
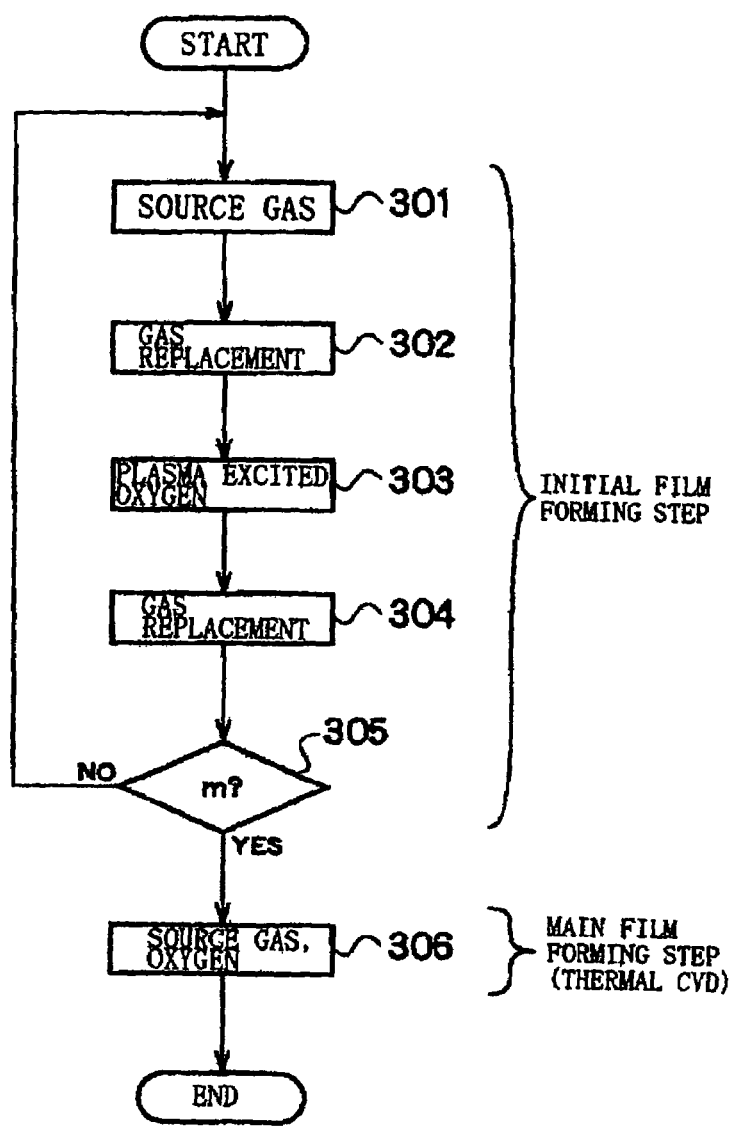
FIG. 3 is a flowchart for describing process steps according to a second embodiment.

Next, Embodiment 2 will be described with reference to a flowchart in FIG. 3. Explanation will be given to an embodiment 2 where the film is formed by two processes of the process to supply the source, gas and the plasma excited oxygen performed once or repeated plural times, and the process by using the thermal CVD method.

An initial film-forming step is a step for forming the film by repeating a cycle including the source gas supplying stop (step 301), the gas replacement step (stop 302), the excited-gas supplying step (step 303) and the gas replacement step (304 The embodiment 2 has two steps of the initial film-forming step (step 306) and the main film-forming step (step 306) where the source gas and the oxygen are simultaneously supplied and the thermal CVD method is used. In the initial film-forming step, the same cycle as that of the embodiment 1 is executed to form a first layer up to the midway part of the final film thickness (steps 301 to 305). The thickness of the first layer thus formed is 5 to 15 nm. The number of cycle is one time or plural times (m). Thereafter, the main film-forming step to continuously executed (step 306) in the same processing chamber 5, with the temperature sot to be 250 to 350° C., which is the same temperature as the initial film-forming step, and the pressure set to be 0.1 to several tens Torr (13.3 to several thousands Pa). Particularly, when the pressure of the main film-forming step is set to be the same pressure as that of the initial film-forming step, the pressure is not changed, when shifting to the main film-forming step from the initial film-forming step. Therefore, the substrate temperature does not vary, and this on tributes to maintaining the inside of the processing chamber 5 in a stable atmosphere.

In the main film-forming step, the valve 14 of the plasma-excited-gas pipe 50 is closed. Then, the valve 10 of the inert gas pipe 42 is closed, and the valve 6 of the vaporized gas pipe 41 is opened. Then, $Ru(EtCp)_2$ gas obtained by vaporizing the organic source is supplied to the substrate 1. At the same time, the valve 16 of the source-decomposed gas pipe 43 is opened, and oxygen gas not excited by plasma is supplied to the substrate 1, to form the Ru film by the thermal CVD method, with the remaining film thickness 20 to 40 nm set to be as a second layer, so as to be 30 to 50 nm in total.

Figure 4:
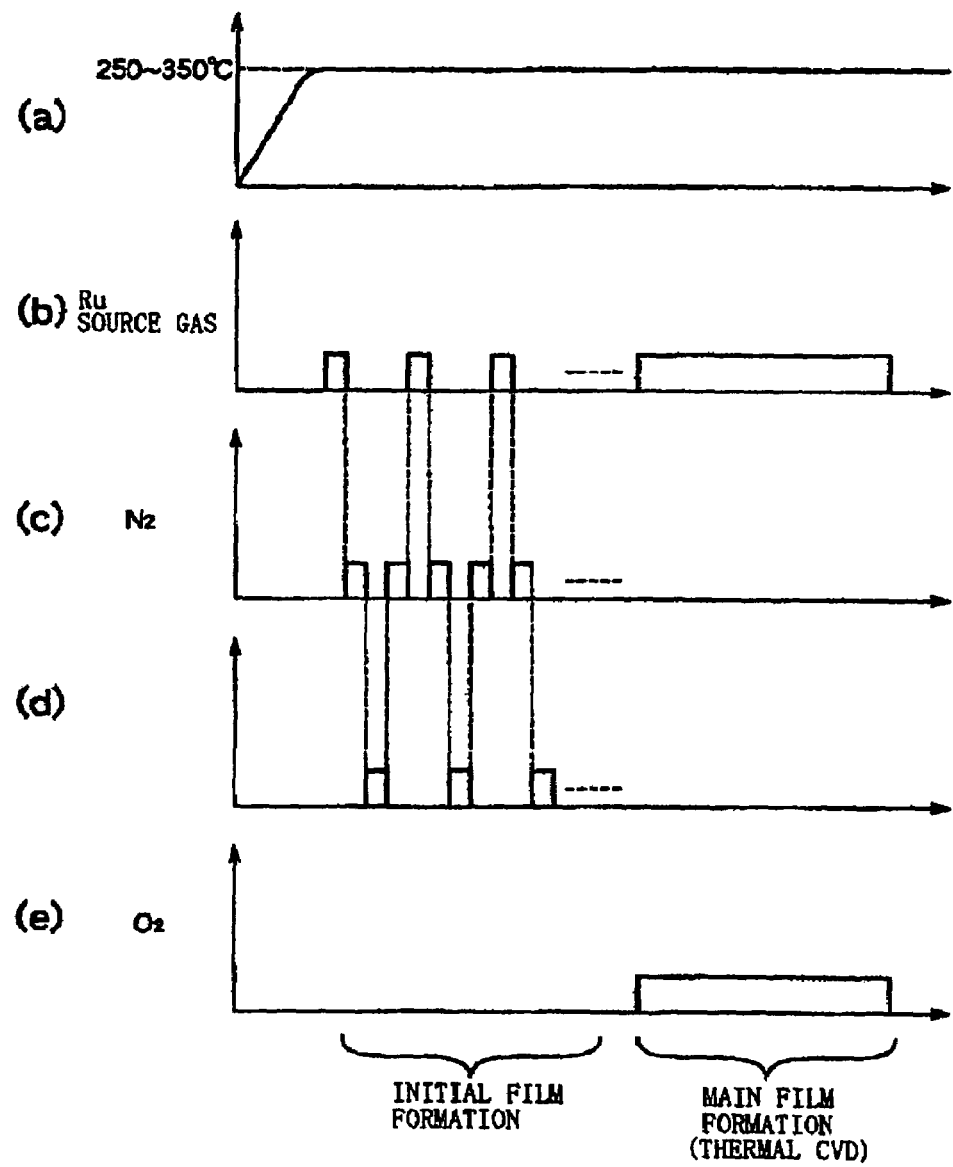
FIG. 4 is a timing chart for describing the process steps according to the second embodiment.

FIG. 4 shows a timing chart in which the aforementioned initial film-forming step of the embodiment 2 (source gas supply→nitrogen gas supply→plasma excited-gas supply→nitrogen gas replacement) is repeated m-cycles, and thereafter, the main film-forming step follows. FIG. 4 is different from FIG. 2 in that consecutive supplying timing of the Ru source gas is added to the latter half of (b), and the oxygen gas supplying timing (e) for continuously supplying the oxygen $O_2$ gas not excited by plasma is added in synchronization with the aforementioned consecutive supplying timing. The processing time of the initial film-forming step is 30 to 180 seconds and, more preferably, is 60 seconds or less. The processing time of the main film-forming process is 60 to 300 seconds (1 to 5 minutes).

As described above, according to embodiment 2, before forming the film by the thermal CVD method in the main film-forming step, the film is formed in the initial film-forming step where the source gas supplying step and the excited-gas supplying step are executed once or repeated plural times. Thus, no incubation time is caused in both of the initial film-forming step and the main film-forming step. Specifically, in the initial film-forming step, the film is formed by source adsorption and the reaction by the plasma excited-gas (complete surface reaction), no incubation time occurs. Since the main film-forming step is the step of forming the Ru film using the RU film as an underlying layer (film formation for forming the same film as the underlying layer), no incubation time occurs. Furthermore, in the main film-forming step, the thermal CVD method is used for forming the film. This contributes to improving the deposition rate, thereby improving the productivity, compared with a case of forming the conductive metal film by repeating the source gas supply and the plasma excited-gas supply from the beginning to the end.

When the initial film-forming stop and the main film-forming step are performed at the same temperature, rise/fall temperature operation requiring time is temperature in shifting from the initial film-forming step to the main film-forming step. Thus, the productivity can be significantly improved. In addition, by setting the temperature equalized in the same processing chamber, the initial film formation and the main film formation can be continuously executed. Thus, the production cost can be reduced. Particularly, since the temperature of 250° C. to 350° C. is a temperature at which the film formation is enabled by the thermal CVD method, and when the initial film-formation is performed at the above temperature, the initial film-formation and the main film-formation can be performed at the same temperature easily. Thus, the productivity of the Ru film can be significantly improved.

In addition, in some cases, the film formed by thermal CVD requires improvement for film quality in the main film-forming step, however the film formed in the initial film-forming step does not require improvement for film quality. Thus, even when improvement for film quality is required for the film formed by thermal CVD in the main film-forming step, the total productivity can be improved.

Moreover, in the aforementioned embodiments 1 and 2, the Ru organic liquid source used in common in the initial film-forming step and the main film-forming stop may be $Ru(C_5H_5)(C_4H_9C_5H_4)$, (butylruthenocene), $RU[CH_3COCHCO(CH_2)_3CH_3]_3$, ($Ru(OD)_3$ for short), $Ru(C_2H_5C_5H_4)((CH_3)C_5H_5)$, (2,4 dimethyipentadienylethylcyclopentadienylruthenium), or $Ru(C_7H_8)(C_7H_{11}O_2)$, in place of $Ru(EtCp)_2$ gas. Also, in place of the plasma excited oxygen gas $O_2$, oxygen containing gas and nitrogen containing gas such as $N_2O$ and Ar. $H_2$ or $N_2$ gas may be used. Furthermore, as the gas not excited by plasma used in the main film-forming step, the oxygen containing gas such as oxygen $O_2$ and $N_2O$ can be used.

Also, in place of the $Ru(EtCp)_2$ suitable for a capacitor electrode, $Ti[(OCH(CH_3)_2)]_4$, $Ti(OCH_2CH_3)_4$, $Ti[N(CH_3)_2]_4$ or $Ti[N(CH_3CH_2)_2]_4$ suitable for barrier metal may be used to form the film. In this case, the conductive metal film serves as a TiN film. Alternatively, $Ta(C_2H_5O)_5$ suitable as barrier metal may be used. In this case, the conductive metal film serves as a TaN film. When the Ti or Ta-based organic metal source is thus used, the organic liquid source is, decomposed by only plasma excitation. Therefore, $NH_3$, Ar, $H_2$ or $N_2$ gas may be used as plasma-excited-gas. $N_2$, $NH_3$ gas or the like may be used as the gas not excited by plasma. In this case, the conductive metal films thus obtained are the TiN film and the TaN film. Therefore, a barrier metal film exerting an excellent diffusion preventive effect can be obtained.

Figure 6:
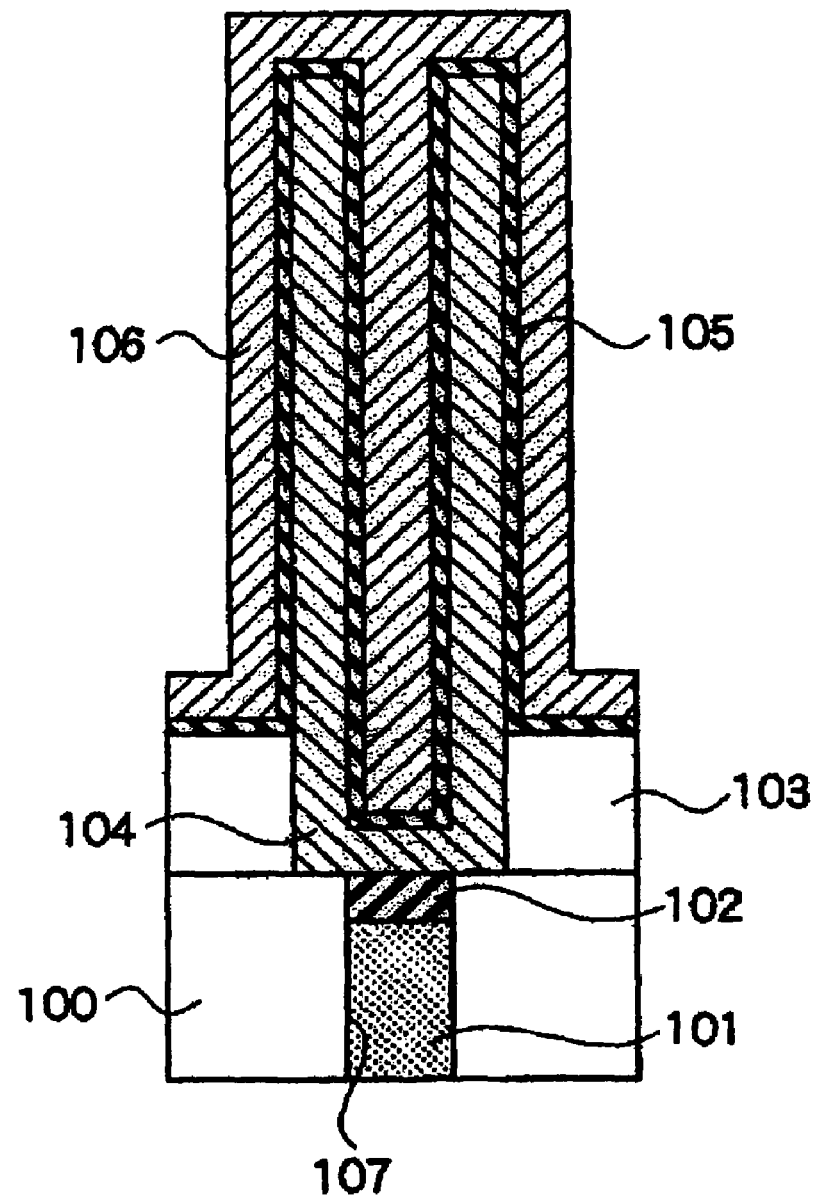
FIG. 6 is a section diagram showing a part of a DRAM including a lower electrode film, an upper electrode film and a barrier metal film to be formed by using a manufacturing method according to an embodiment.

FIG. 6 is a sectional view showing a part of a DRAM in which conductive metal film formed by using the manufacturing method of the semiconductor device as described above is applied to the barrier metal film, the upper electrode and the lower electrode of a capacitor.

After a gate is formed on a silicon substrate or the underlying layer formed on the silicon substrate an interlayer insulating film 100 composed of an insulating material such as silicon oxide in deposited thereon. Then, a contact hole is opened and in the contact hole, a contact plug 101 for connecting with the substrate is formed. The contact plug is composed of polysilicon and/or tungsten. Further, a barrier metal film 102 is formed by the manufacturing method according to the embodiment 1 or 2 so as to fill in the upper space of the contact plug 101 within the contact hole 107. The barrier metal film 102 is formed for preventing the diffusion of a material forming the electrode and/or an oxidizing agent to the contact plug 101.

After an inter-layer insulating film 103 is deposited on the inter-layer insulating film 100 having the contact hole 107 formed with the contact plug 101 and the barrier metal film 102 inside, the contact hole is opened. Then, a lower electrode 104 is formed by the manufacturing method according to the above-described embodiment 1 or 2 on the entire surface of the inter-layer insulating film 103 including the contact hole thus opened. The surfaces of the lower electrode film on the inter-layer insulating film 103 and the interlayer insulating film 103 excluding the contact hole and inter-layer insulating film 103 are removed so that the cylindrical lower electrode 104 is exposed. When the thickness of the lower electrode 104 is smaller than 20 nm, the strength of the cylinder cannot be maintained, resulting in tilting and breaking of the cylinder. When the thickness is larger than 50 nm, a capacitor insulating film and the upper electrode in the cylinder are difficult to form. Therefore, the thickness is preferably set to be 20 to 50 nm. After the lower electrode 104 is exposed, a capacitance insulating film 105 is formed on the lower electrode 10 by a predetermined manufacturing method. Then, an upper electrode film 106 is formed thereon by the manufacturing method according to the above-described embodiments 1 and 2.

As described above, when the conductive metal film is applied to the capacitor electrode or the barrier metal for preventing diffusion, a cylindrical electrode having low resistance, excellent in the step coverage, and having high aspect ratio can be realized. Therefore, in association with the microminiaturization of the DRAM, the storage charge capacity can be ensured. Especially, the film of the DRAM formed by the method according to the embodiment is not a nonconductive metal oxide film, but a conductive metal film, which is suitably used as the capacitor electrode and the barrier metal film. A metal film such as the DRAM can be appropriately selected from various kinds according to the use of the film. Generally, as the lower electrode or the upper electrode of the capacitor, $RuO_2$, Pt, Ir and/or $IrO_2$ are given as examples, other than the Ru. Also, as the barrier metal, the TiN and the TaN are given as examples. In the case of the $RuO_2$, Pt, Ir and/or $IrO_2$, the oxygen containing gas such as oxygen $O_2$ and $N_2O$ is supplied as the gas not excited by plasma, which is used in the main film-forming process. In the case of the TiN and the TaN, the nitrogen-containing gas such as $N_2$ and $NH_3$ gas is supplied as the gas not excited by plasma, which is used in the main film forming step. It is considered that in the same way as the Ru film and the Ir film, the $RuO_2$ film and the $IrO_2$ film, which are conductive metal oxide films, are used as the capacitor electrode. Such conductive metal oxide films can be formed by changing deposition conditions (such as oxygen concentration, temperature, and pressure) when forming the Ru film and the Ir film. Furthermore, the conductive metal film of the present invention can be applied to a gate electrode and so on in addition to the capacitor electrode and the barrier metal film.

INDUSTRIAL APPLICABILITY

According to a method of the present invention, after gas obtained by vaporizing an organic source is supplied, plasma-excited-gas is supplied to form a conductive metal film, and a semiconductor device having superior step coverage and adhesiveness with high productivity can be manufactured. Furthermore, according to the method of the present invention, after the gas obtained by vaporizing the organic source is supplied in an initial film-forming step, plasma excited-gas is supplied to form the conductive metal film. Then, in a main film-forming step that follows thereafter, the film is formed by using a thermal CVD method. This contributes to improving deposition rate, thereby further improving the productivity. In addition, when a device of the present invention is used to form the conductive metal film, film-forming work is further facilitated and the metal film excellent in property can therefore be formed.

The invention claimed is:

1. A method of manufacturing a semiconductor device, comprising:

an initial film-forming step of forming an initial metal film on a substrate by executing once or a plurality of times, a source gas supplying step of supplying gas obtained by vaporizing an organic source to the substrate and allowing the organic source to be adsorbed on the substrate, and thereafter an excited-gas supplying step of supplying gas excited by plasma to the substrate, and causing the organic source adsorbed on the substrate to react with the gas excited by plasma, and forming a metal film on the substrate; and a main film-forming step of forming a main metal film being the same film as the initial metal film on the initial metal film using a thermal CVD method, by simultaneously supplying the gas obtained by vaporizing the organic source and oxygen-containing gas or nitrogen-containing gas not excited by plasma, the initial film-forming step and the main film-forming step being performed in the same processing chamber and performed at the same processing temperature.

2. The method of manufacturing the semiconductor device according to claim 1, wherein film thickness of the initial metal film formed in the initial film-forming step is set to be 5 to 15 nm, and film thickness of the main metal film formed in the main film-forming step is set to be 20 to 40 nm.

3. The method of manufacturing the semiconductor device according to claim 1, wherein the processing temperature of the initial film-forming step and the main film-forming step are 250° C. to 350° C.

* * * * *